United States Patent
McCormick

(10) Patent No.: US 10,063,068 B1
(45) Date of Patent: Aug. 28, 2018

(54) BATTERY SYSTEM

(71) Applicant: LG Chem, Ltd., Seoul (KR)

(72) Inventor: Richard McCormick, Troy, MI (US)

(73) Assignee: LG Chem, Ltd., Seoul (KR)

( * ) Notice: Subject to any disclaimer, the term of this patent is extended or adjusted under 35 U.S.C. 154(b) by 38 days.

(21) Appl. No.: 15/484,912

(22) Filed: Apr. 11, 2017

(51) Int. Cl.
  *H02J 7/00* (2006.01)
  *H01M 10/48* (2006.01)
  *G01R 31/36* (2006.01)

(52) U.S. Cl.
  CPC ........ *H02J 7/0016* (2013.01); *G01R 31/3606* (2013.01); *H01M 10/486* (2013.01); *H02J 7/0021* (2013.01)

(58) Field of Classification Search
  CPC .. H02J 7/0016; H02J 7/0021; G01R 31/3606; H01M 10/486
  USPC .......................................................... 320/118
  See application file for complete search history.

(56) References Cited

U.S. PATENT DOCUMENTS

| | | | | |
|---|---|---|---|---|
| 7,460,338 B2* | 12/2008 | Okabe | ................... | G11B 5/486 360/245.9 |
| 8,830,676 B2* | 9/2014 | Borck | ................ | H01M 2/1061 165/104.33 |
| 8,996,931 B2* | 3/2015 | Hartlieb | ............ | H04L 12/40013 714/25 |
| 9,000,771 B2 | 4/2015 | Owens et al. | | |
| 9,112,370 B2* | 8/2015 | Yen | ........................ | H02J 7/0016 |
| 9,203,248 B2* | 12/2015 | Ohkawa | ................ | B60L 3/0046 |
| 9,746,525 B2* | 8/2017 | Kudo | .................... | B60L 3/0046 |
| 9,876,369 B2* | 1/2018 | McCormick | .......... | G01R 31/44 |
| 2008/0238370 A1* | 10/2008 | Carrier | ................ | H01M 2/1022 320/134 |

OTHER PUBLICATIONS

U.S. Appl. No. 15/070,834, filed Mar. 15, 2016 entitled Battery System and Method for Determining an Open Circuit Fault Condition in a Battery Module.

* cited by examiner

*Primary Examiner* — M'Baye Diao
(74) *Attorney, Agent, or Firm* — Buckert Patent & Trademark Law Firm, PC; John F. Buckert

(57) ABSTRACT

A battery system includes a battery module having first and second battery cells. The battery system further includes first and second cell balancing circuits and a microcontroller. The microcontroller determines a first cell balancing current value indicating an amount of electrical current flowing through a first resistor of the first cell balancing circuit based on the first, second, third, and fourth voltage values and a first resistance value. The microcontroller generates a first fault condition code indicating an operational failure of the first transistor in the first balancing circuit if the first cell balancing current value is less than a minimum desired current value.

10 Claims, 6 Drawing Sheets

BATTERY SYSTEM

BACKGROUND

The inventor herein has recognized a need for an improved battery system that detects degraded operation of a first cell balancing circuit utilizing voltage measurements from both the first cell balancing circuit and a second cell balancing circuit.

SUMMARY

A battery system in accordance with an exemplary embodiment is provided. The battery system includes a battery module having first and second battery cells. The battery system further includes a first cell balancing circuit that is electrically coupled to first and second electrical sense lines and to first and second electrical terminals of the first battery cell. The first cell balancing circuit has a first resistor and a first transistor therein. The first transistor is electrically coupled between the first and second electrical sense lines. The first resistor is electrically coupled in series with the first electrical sense line and is further electrically coupled to the first transistor. The battery system further includes a second cell balancing circuit that is electrically coupled to the second and third electrical sense lines and to first and second electrical terminals of the second battery cell. The second cell balancing circuit has a second transistor therein. The second transistor is electrically coupled between the second and third electrical sense lines. The battery system further includes an integrated circuit measuring a first voltage between the second electrical sense line and the first electrical sense line at a first time while the first transistor in the first cell balancing circuit is commanded to be turned off by a microcontroller, and sending a first voltage value corresponding to the first voltage to the microcontroller. The integrated circuit measures a second voltage between the second electrical sense line and the first electrical sense line at a second time while the first transistor in the first cell balancing circuit is commanded to be turned on by the microcontroller, and sending a second voltage value corresponding to the second voltage to the microcontroller. The integrated circuit measures a third voltage between the third electrical sense line and the second electrical sense line at a third time while the second transistor in the second cell balancing circuit is commanded to be turned off by the microcontroller, and sends a third voltage value corresponding to the third voltage to the microcontroller. The integrated circuit measures a fourth voltage between the third electrical sense line and the second electrical sense line at a fourth time while the second transistor in the second cell balancing circuit is commanded to be turned on by the microcontroller, and sends a fourth voltage value corresponding to the fourth voltage to the microcontroller. The microcontroller determines a first cell balancing current value indicating an amount of electrical current flowing through the first resistor of the first cell balancing circuit based on the first, second, third, and fourth voltage values and a first resistance value, the first resistance value corresponding to a resistance of the first resistor. The microcontroller generates a first fault condition code indicating an operational failure of the first transistor in the first balancing circuit if the first cell balancing current value is less than a minimum desired current value. The battery system further includes a first temperature sensor generating a first temperature signal indicative of a temperature level of the first resistor in the first cell balancing circuit that is received by the integrated circuit. The battery system further includes a second temperature sensor generating a second temperature signal indicative of a temperature level of the battery module that is received by the integrated circuit. The integrated circuit determines a first temperature value of the first resistor at the first time based on the first temperature signal, and sends the first temperature value to the microcontroller. The integrated circuit determines a second temperature value of the battery module at the first time based on the second temperature signal, and sends the second temperature value to the microcontroller. The microcontroller generates a second fault condition code indicating that the first balancing circuit is continuously turned on if a difference between the first and second temperature values is greater than a threshold temperature difference value.

DETAILED DESCRIPTION

Figure 1:
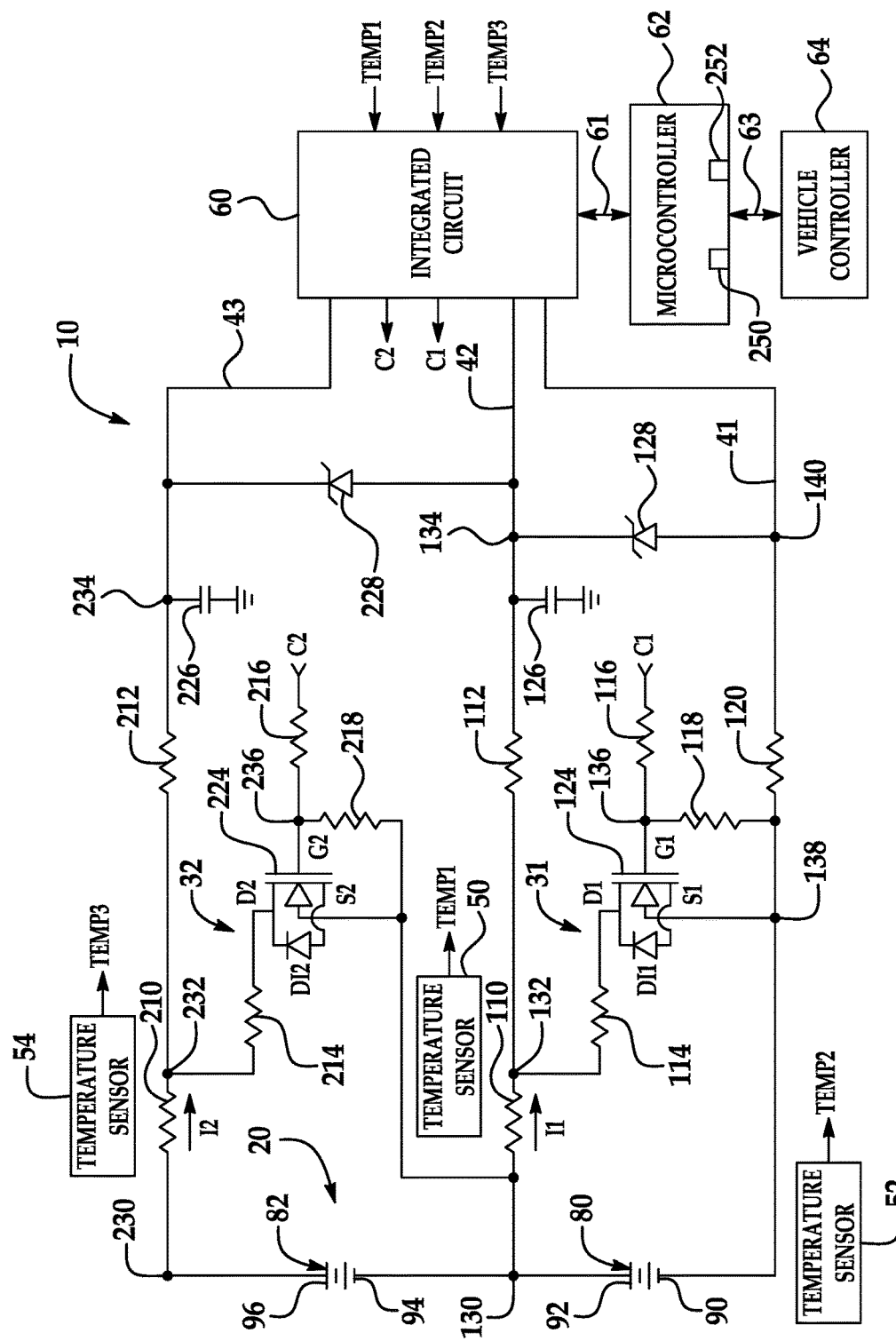
FIG. 1 is a schematic of a battery system in accordance with an exemplary embodiment.
Figure 2:
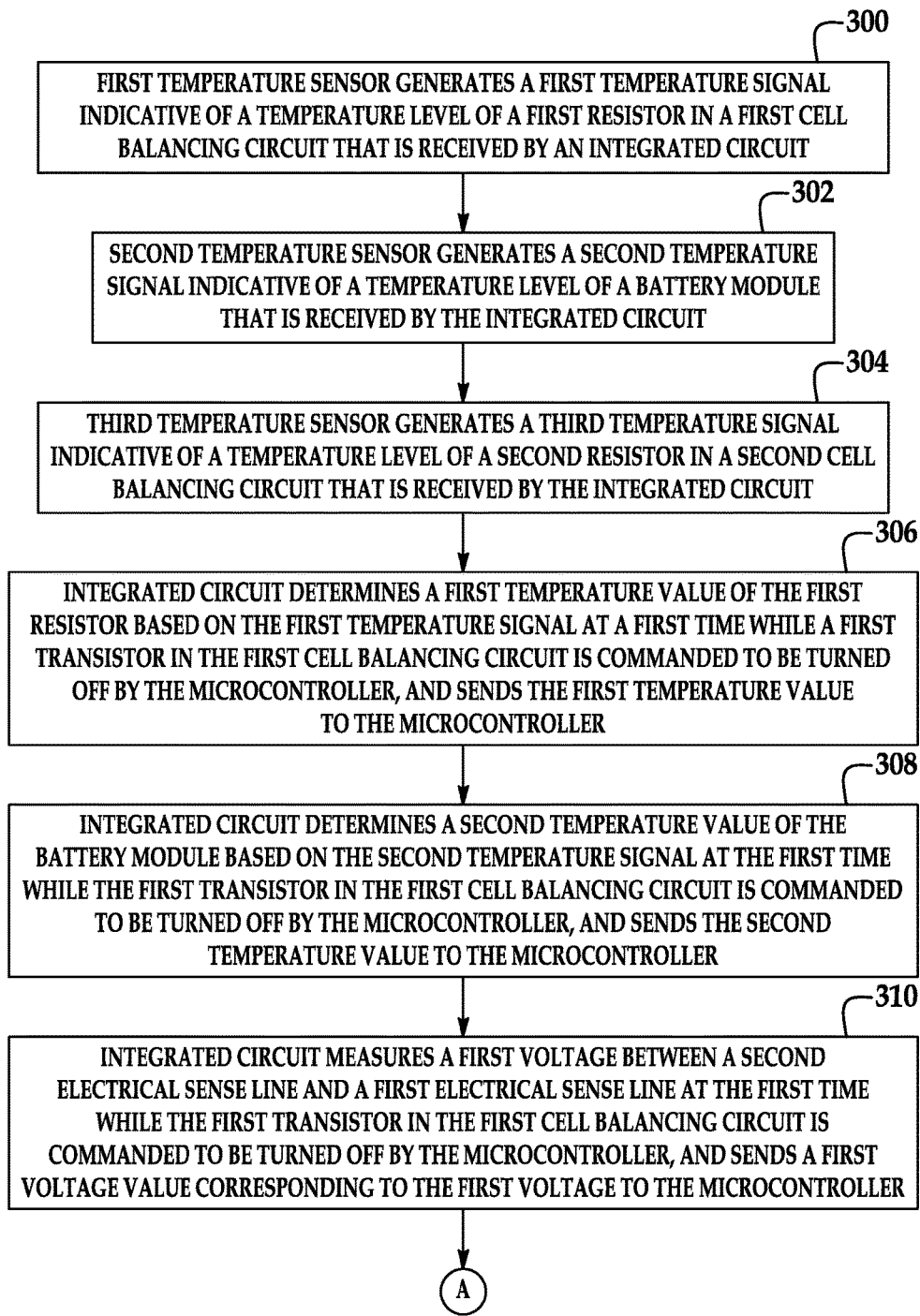
FIGS. 2-6 are flowcharts of a method for determining operational fault conditions in cell balancing circuits within the battery system of FIG. 1 in accordance with another exemplary embodiment.
Figure 3:
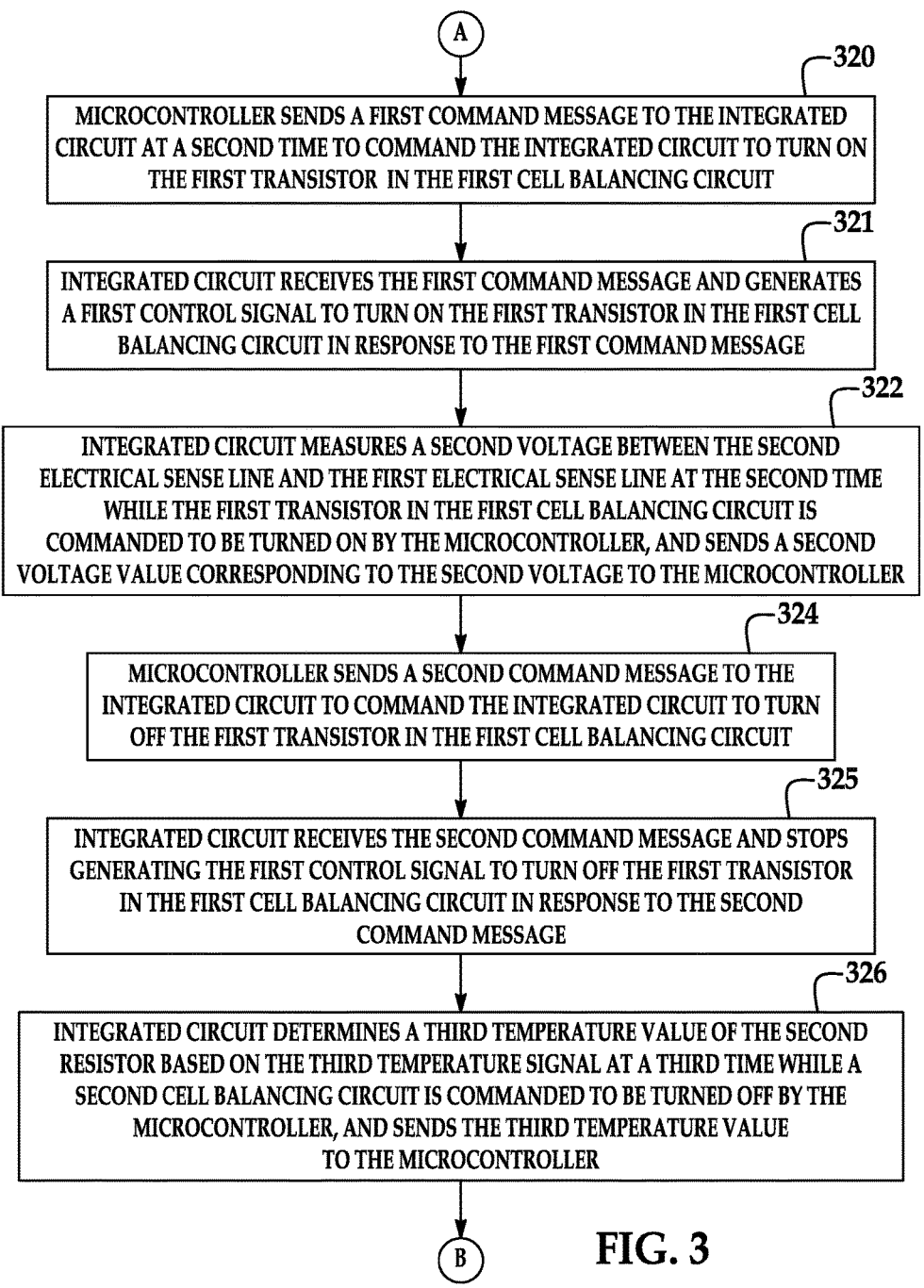
Figure 4:
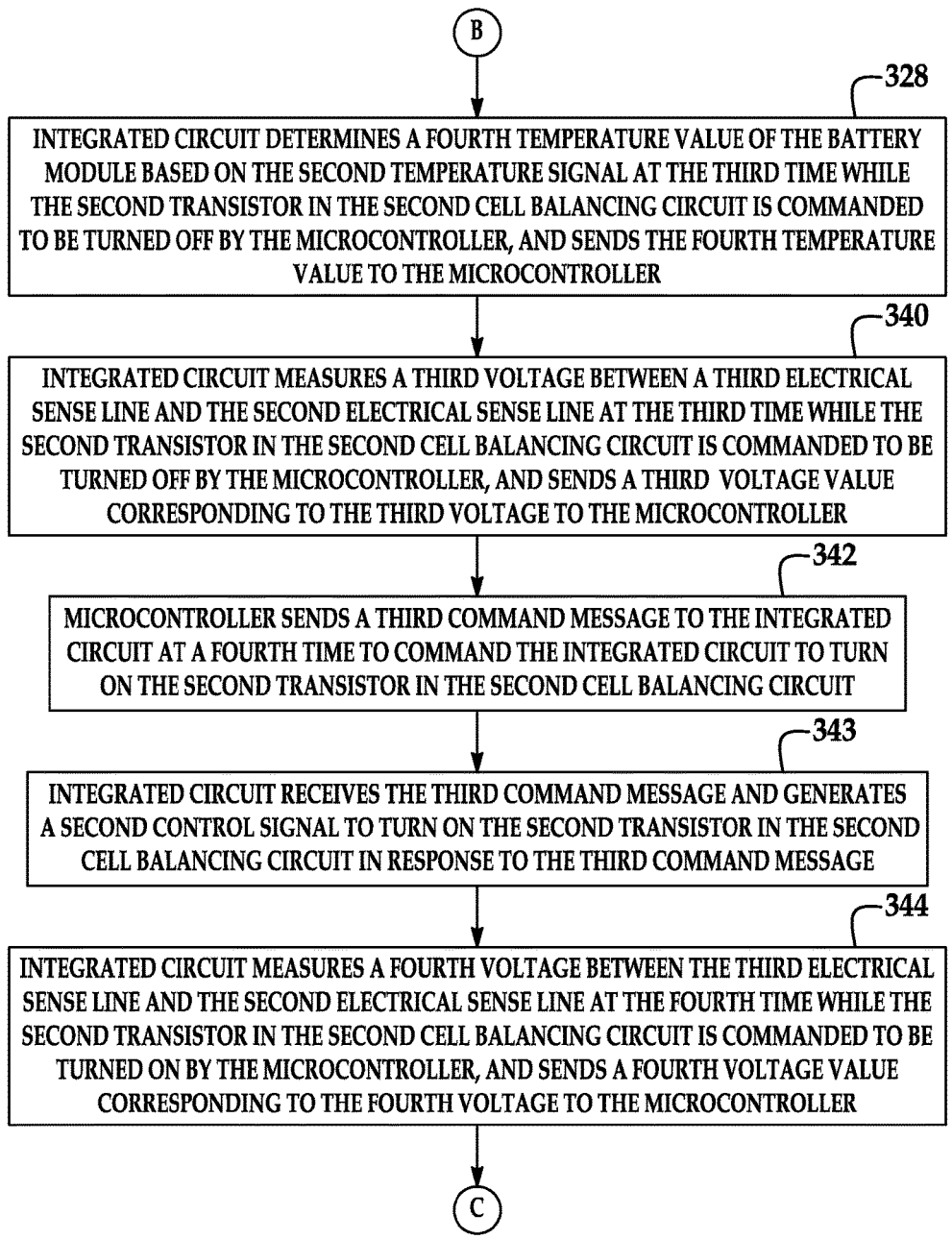
Figure 5:
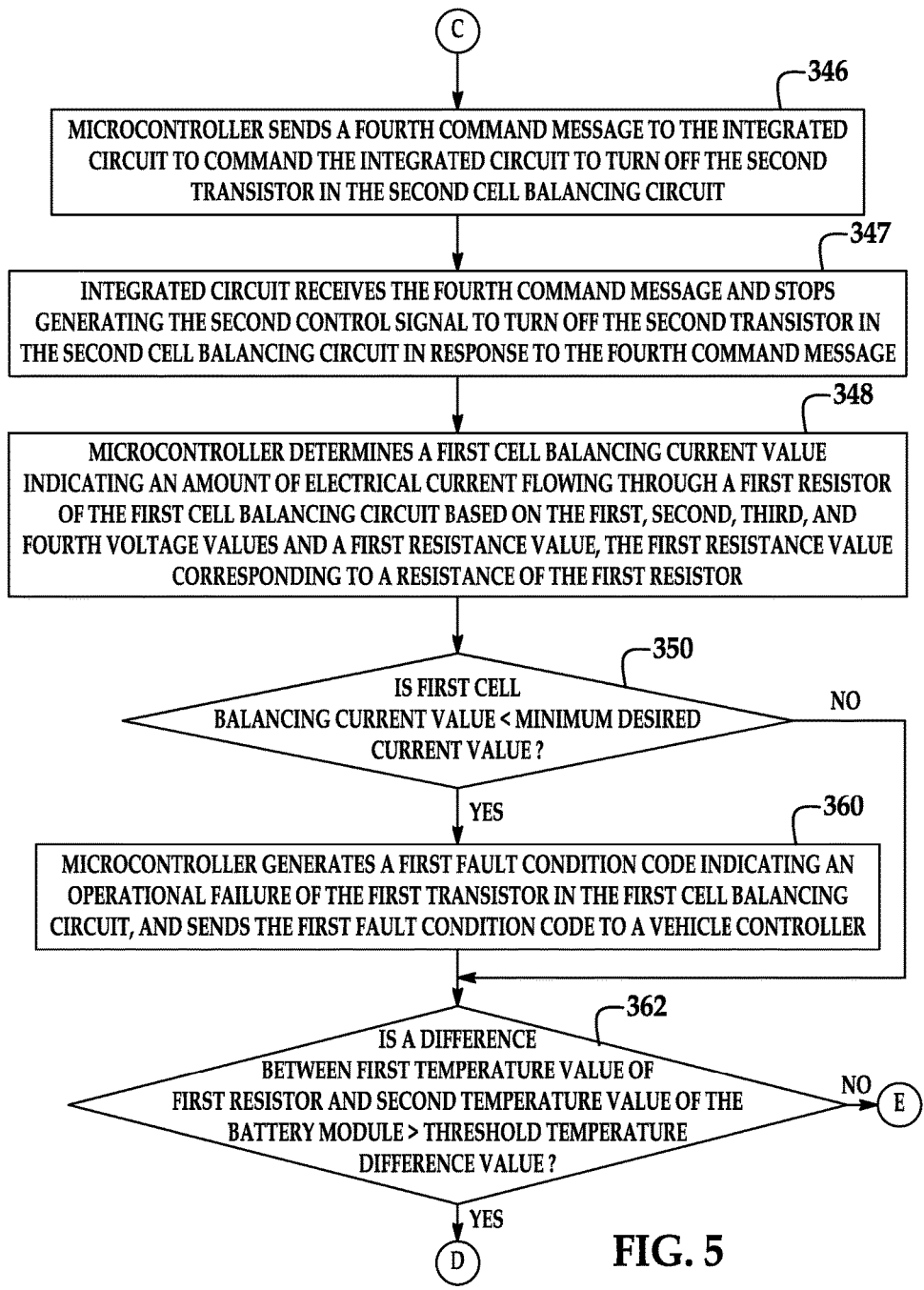
Figure 6:
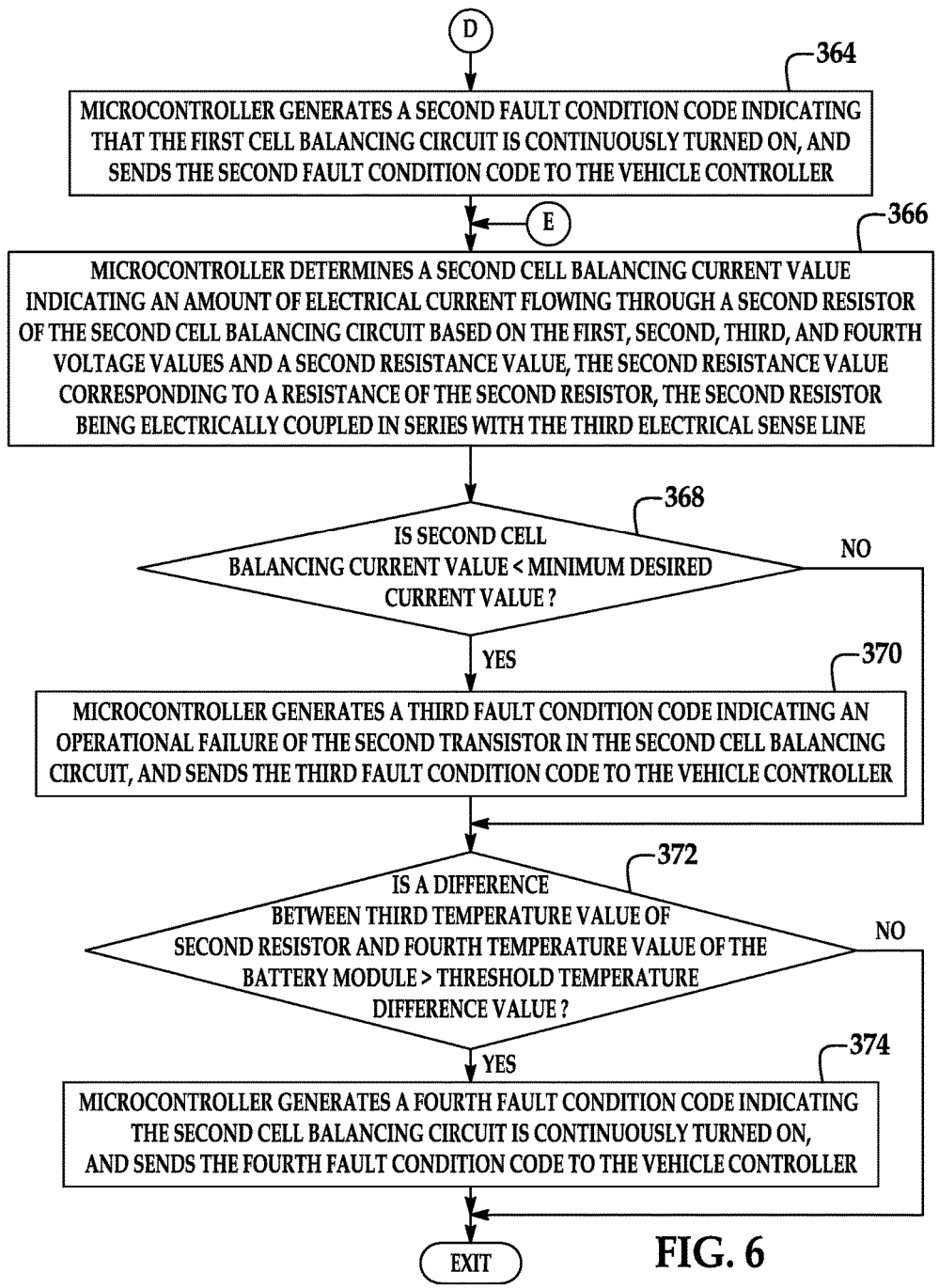

Referring to FIG. 1, a battery system 10 in accordance with an exemplary embodiment is provided. The battery system 10 includes a battery module 20, a first cell balancing circuit 31, a second cell balancing circuit 32, a first electrical sense line 41, a second electrical sense line 42, a third electrical sense line 43, temperature sensors 50, 52, 54, an integrated circuit 60, a communication bus 61, a microcontroller 62, a communication bus 63, and a vehicle controller 64.

An advantage of the battery system 10 is that the microcontroller 62 determines operational fault conditions of the first cell balancing circuit 30 utilizing voltages measured from the first and second balancing circuits 31, 32. Further, the microcontroller 62 determines operational fault conditions of the second cell balancing circuit 32 utilizing voltages measured from the first and second balancing circuits 31, 32. Still further, the microcontroller 62 determines operational fault conditions in the first and second balancing circuits 31, 32 based on the first, second, and third temperature signals (TEMP1, TEMP2, TEMP3) associated with the first balancing circuit 31, the battery module 20, and the second balancing circuit 32, respectively.

The battery module 20 includes a first battery cell 80 and a second battery cell 82 electrically coupled in series with one another.

The first battery cell 80 includes a first electrical terminal 90 and a second electrical terminal 92. In an exemplary embodiment, the first battery cell 80 is a pouch-type lithium-ion battery cell. In an alternative embodiment, the first battery cell 80 is another type of battery cell known to those skilled in the art. The first battery cell 80 is electrically coupled to the first cell balancing circuit 31.

The second battery cell 82 includes a first electrical terminal 94 and a second electrical terminal 96. In an exemplary embodiment, the second battery cell 82 is a pouch-type lithium-ion battery cell. In an alternative embodiment, the second battery cell 82 is another type of battery cell known to those skilled in the art. The second battery cell 82 is electrically coupled to the second balancing circuit 92 of the monitoring circuit 30.

The first cell balancing circuit 31 is adapted to selectively discharge an electrical current from the first battery cell 80. The first cell balancing circuit 31 includes resistors 110, 112, 114, 116, 118, 120, a transistor 124, a capacitor 126, a Zener diode 128, and electrical nodes 130, 132, 134, 136, 138, 140.

The resistor 110 is electrically coupled to the electrical node 130 and to the second electrical terminal 92 of the battery cell 80. In an exemplary embodiment, the resistor 110 has a resistance of 2 ohms. The resistor 114 is electrically coupled to and between the electrical node 132 and the drain D1 of the transistor 124.

The transistor 124 is adapted to control a balancing electrical current from the first battery cell 80. The transistor 124 includes a gate terminal G1, the drain terminal D1, a source terminal S1, and an internal diode DI1.

The drain terminal D1 is electrically coupled to the resistor 114. The source terminal S1 is electrically coupled to the electrical node 138, and the electrical node 138 is electrically coupled to the first electrical terminal 90 of the first battery cell 80. The gate terminal G1 is electrically coupled to the electrical node 136.

The resistor 116 is electrically coupled to and between the electrical node 136 and to the microcontroller 62. Further, the resistor 118 is electrically coupled to and between the electrical node 136 and electrical node 138, and is electrically coupled in parallel between the gate terminal G1 and the source terminal S1 of the transistor 124. The microcontroller 62 sends a command message to the integrated circuit 60 to induce the integrated circuit 60 to selectively generate a control voltage C1 that is divided by the resistors 116, 118 and is thereafter applied to the gate G1 for turning on the transistor 124.

The resistor 120 is electrically coupled to and between the electrical node 138 and the electrical node 140. The electrical node 140 is further electrically coupled through the first electrical sense line 41 to the integrated circuit 60.

The resistor 112 is electrically coupled to and between the electrical node 132 and an electrical node 134. The electrical node 134 is further electrically coupled through the second electrical sense line 42 to the integrated circuit 60. The capacitor 126 is coupled to and between the electrical node 134 and electrical ground. Further, the Zener diode 128 is coupled to and between the electrical node 134 and the electrical node 140, and is electrically coupled between the electrical sense lines 41, 42.

During normal operation when the first cell balancing circuit 31 is operating as desired without any operational faults, when the microcontroller 62 sends a command message to the integrated circuit 60 to induce the integrated circuit 60 to generate the control signal C1 that is received by the transistor 124, the transistor 124 turns on which allows an electrical current (or cell balancing current) (I1) to flow through the resistor 110, and the resistor 114, and the transistor 124 to at least partially discharge the battery cell 80.

The second cell balancing circuit 32 is adapted to selectively discharge an electrical current from the second battery cell 82. The second cell balancing circuit 32 includes resistors 210, 212, 214, 216, 218, 220, a transistor 224, a capacitor 226, a Zener diode 228, and electrical nodes 230, 232, 234, 236, 130.

The resistor 210 is electrically coupled to the electrical node 230 and to the second electrical terminal 96 of the battery cell 82. In an exemplary embodiment, the resistor 210 has a resistance of 2 ohms. The resistor 214 is electrically coupled to and between the electrical node 232 and the drain D2 of the transistor 224.

The transistor 224 is adapted to control a balancing electrical current from the second battery cell 82. The transistor 224 includes a gate terminal G2, a drain terminal D2, a source terminal S2, and an internal diode DI2.

The drain terminal D2 is electrically coupled to the resistor 214. The source terminal S2 is electrically coupled to the electrical node 130, and the electrical node 130 is electrically coupled to the first electrical terminal 94 of the second battery cell 82. The gate terminal G2 is electrically coupled to the electrical node 236.

The resistor 216 is electrically coupled to and between the electrical node 236 and to the microcontroller 62. Further, the resistor 218 is electrically coupled to and between the electrical node 236 and electrical node 130, and is electrically coupled in parallel between the gate terminal G2 and the source terminal S2 of the transistor 224. The microcontroller 62 sends a command message to the integrated circuit 60 to induce the integrated circuit 60 to selectively generate a control voltage C2 that is divided by the resistors 216, 218 and is thereafter applied to the gate G2 for turning on the transistor 224.

The resistor 212 is electrically coupled to and between the electrical node 232 and an electrical node 234. The electrical node 234 is further electrically coupled through the third electrical sense line 43 to the integrated circuit 60. The capacitor 226 is coupled to and between the electrical node 234 and electrical ground. Further, the Zener diode 228 is coupled to and between the electrical node 234 and the electrical node 134, and is electrically coupled between the second and third electrical sense lines 42, 43.

During normal operation when the second cell balancing circuit 32 is operating as desired without any operational faults, when the microcontroller 62 sends a command message to the integrated circuit 60 to induce the integrated circuit 60 to generate the control signal C2 that is received by the transistor 224, the transistor 224 turns on which allows an electrical current (or cell balancing current) (I2) to flow through the resistor 210, and the resistor 214, and the transistor 224 to at least partially discharge the battery cell 82.

The first and second electrical sense lines 41, 42 are utilized by the integrated circuit 60 to measure a voltage across the first cell balancing circuit 31. The first electrical sense line 41 is electrically coupled to and between the electrical node 140 and the integrated circuit 60. Further, the second electrical sense line 42 is electrically coupled to and between the electrical node 134 and the integrated circuit 60.

The second and third electrical sense lines 42, 43 are utilized by the integrated circuit 60 to measure a voltage across the second cell balancing circuit 32. As discussed above, the second electrical sense line 42 is electrically coupled to and between the electrical node 134 and the integrated circuit 60. The third electrical sense line 43 is electrically coupled to and between the electrical node 234 and the integrated circuit 60.

The temperature sensor 50 generates a first temperature signal (TEMP1) indicative of a temperature level of the resistor 110 in the first cell balancing circuit 31 that is received by the integrated circuit 60. The temperature sensor 50 is disposed proximate to the resistor 110 and is electrically coupled to the integrated circuit 60.

The temperature sensor 52 generates a second temperature signal (TEMP2) indicative of a temperature level of the battery module 20 that is received by the integrated circuit 60. The temperature sensor 52 is disposed proximate to the battery module 20 and is electrically coupled to the integrated circuit 60.

The temperature sensor 54 generates a third temperature signal (TEMP3) indicative of a temperature level of the resistor 210 in the second cell balancing circuit 32 that is received by the integrated circuit 60. The temperature sensor 54 is disposed proximate to the resistor 210 and is electrically coupled to the integrated circuit 60.

The integrated circuit 60 is electrically coupled to the first, second, and third electrical sense lines 41, 42, 43 and to the resistors 116, 216. The integrated circuit 60 operably communicates with the microcontroller 61 utilizing a communication bus 61. The integrated circuit 60 measures voltages between the first and second electrical sense lines 41, 42 and sends associated voltage values to the microcontroller 26 so the microcontroller 62 can determine an amount of electrical current (I1) flowing through the resistor 110, as will be explained in greater detail below. Further, the integrated circuit 60 measures voltages between the second and third electrical sense lines 42, 43 and sends associated voltage values to the microcontroller 26 so the microcontroller 62 can determine an amount of electrical current (I2) flowing through the resistor 110, as will be explained in greater detail below.

The microcontroller 62 generates command messages to induce the integrated circuit 60 to turn on and to turn off the transistors 124, 224 in the first and second cell balancing circuit 31, 32, respectively. The microcontroller 62 can detect fault conditions in the first and second balancing circuits 31, 32 based on the first current value (I1) and the second current value (I2), and generate associated fault condition codes that are sent to the vehicle controller 64, as will be explained in greater detail below. The microcontroller 62 can further detect fault conditions in the first and second balancing circuits 31, 32 based on the first, second, and third temperature signals (TEMP1, TEMP2, TEMP3), and generate associated fault condition codes that are sent to the vehicle controller 64, as will be explained in greater detail below. The microcontroller 62 includes a microprocessor 250 and a memory device 252. The microprocessor 250 is programmed to execute a software program stored in the memory device 252 to implement at least a portion of the operational steps associated with the microprocessor 250 that will be described hereinafter. The microcontroller 62 operably communicates with the integrated circuit 60 utilizing the communication bus 61. Also, the microcontroller 62 operably communicates with the vehicle controller 64 utilizing the communication bus 63.

Referring to FIGS. 1-6, a flowchart of a diagnostic method for the battery system 10 in accordance with another exemplary embodiment will now be explained.

At step 300, the temperature sensor 50 generates a first temperature signal indicative of a temperature level of the resistor 110 in the first cell balancing circuit 31 that is received by the integrated circuit 60. After step 300, the method advances to step 302.

At step 302, the temperature sensor 52 generates a second temperature signal indicative of a temperature level of the battery module 20 that is received by the integrated circuit 60. After step 302, the method advances to step 304.

At step 304, the temperature sensor 54 generates a third temperature signal indicative of a temperature level of the resistor 210 in the second cell balancing circuit 32 that is received by the integrated circuit 60. After step 304, the method advances to step 306.

At step 306, the integrated circuit 60 determines a first temperature value of the resistor 110 based on the first temperature signal at a first time while the transistor 124 in the first cell balancing circuit 31 is commanded to be turned off by the microcontroller 62, and sends the first temperature value to the microcontroller 62. After step 306, the method advances to step 308.

At step 308, the integrated circuit 60 determines a second temperature value of the battery module 20 based on the second temperature signal at the first time while the transistor 124 in the first cell balancing circuit 31 is commanded to be turned off by the microcontroller 62, and sends the second temperature value to the microcontroller 62. After step 308, the method advances to step 310.

At step 310, the integrated circuit 60 measures a first voltage between the second electrical sense line 42 and the first electrical sense line 41 at the first time while the transistor 124 in the first cell balancing circuit 31 is commanded to be turned off by the microcontroller 62, and sends a first voltage value corresponding to the first voltage to the microcontroller 62. After step 310, the method advances to step 320.

At step 320, the microcontroller 62 sends a first command message to the integrated circuit 60 at a second time to command the integrated circuit 60 to turn on the transistor 124 in the first cell balancing circuit 31. After step 320, the method advances to step 321.

At step 321, the integrated circuit 60 receives the first command message and generates a first control signal to turn on the transistor 124 in the first cell balancing circuit 31 in response to the first command message. After step 321, the method advances to step 322.

At step 322, the integrated circuit 60 measures a second voltage between the second electrical sense line 42 and the first electrical sense line 41 at the second time while the transistor 124 in the first cell balancing circuit 31 is commanded to be turned on by the microcontroller 62, and sends a second voltage value corresponding to the second voltage to the microcontroller 62. After step 322, the method advances to step 324.

At step 324, the microcontroller 62 sends a second command message to the integrated circuit 60 to command the integrated circuit 60 to turn off the transistor 124 in the first cell balancing circuit 31. After step 324, the method advances to step 325.

At step 325, the integrated circuit 60 receives the second command message and stops generating the first control signal to turn off the transistor 124 in the first cell balancing circuit 31 in response to the second command message. After step 325, the method advances to step 326.

At step 326, the integrated circuit 60 determines a third temperature value of the resistor 210 based on the third temperature signal at a third time while a transistor 224 in the second cell balancing circuit 32 is commanded to be turned off by the microcontroller 62, and sends the third temperature value to the microcontroller 62. After step 326, the method advances to step 328.

At step 328, the integrated circuit 60 determines a fourth temperature value of the battery module 20 based on the second temperature signal at the third time while the transistor 224 in the second cell balancing circuit 32 is commanded to be turned off by the microcontroller 62, and sends the fourth temperature value to the microcontroller 62. After step 328, the method advances to step 340.

At step 340, the integrated circuit 60 measures a third voltage between a third electrical sense line 43 and the second electrical sense line 42 at the third time while the transistor 224 in the second cell balancing circuit 32 is commanded to be turned off by the microcontroller 62, and sends a third voltage value corresponding to the third voltage to the microcontroller 62. After step 340, the method advances to step 342.

At step 342, the microcontroller 62 sends a third command message to the integrated circuit 60 at a fourth time to command the integrated circuit 60 to turn on the transistor 224 in the second cell balancing circuit 32. After step 342, method advances to step 343.

At step 343, the integrated circuit 60 receives the third command message and generates a second control signal to turn on the transistor 224 in the second cell balancing circuit 32 in response to the third command message. After step 343, the method advances to step 344.

At step 344, the integrated circuit 60 measures a fourth voltage between the third electrical sense line 43 and the second electrical sense line 42 at the fourth time while the transistor 224 in the second cell balancing circuit 32 is commanded to be turned on by the microcontroller 62, and sends a fourth voltage value corresponding to the fourth voltage to the microcontroller 62. After step 344, the method advances to step 346

At step 346, the microcontroller 62 sends a fourth command message to the integrated circuit 60 to command the integrated circuit 60 to turn off the transistor 224 in the second cell balancing circuit 32. After step 346, the method advances to step 347.

At step 347, the integrated circuit 60 receives the fourth command message and stops generating the second control signal to turn off the transistor 224 in the second cell balancing circuit 32 in response to the fourth command message. After step 347, the method advances to step 348.

At step 348, microcontroller 62 determines a first cell balancing current value indicating an amount of electrical current flowing through the resistor 110 of the first cell balancing circuit 31 based on the first, second, third, and fourth voltage values and a first resistance value. The first resistance value corresponds to a resistance of the resistor 110. In an exemplary embodiment, the microcontroller 62 determines the first cell balancing current value utilizing the following equation: first cell balancing current value=((first voltage value−second voltage value)−2*(fourth voltage value−third voltage value)))/first resistance value. After step 348, the method advances to step 350.

At step 350, the microcontroller 62 makes a determination as to whether the first cell balancing current value is less than a minimum desired current value. If the value of step 350 equals "yes", the method advances to step 360. Otherwise, the method advances to step 362.

At step 360, the microcontroller 62 generates a first fault condition code indicating an operational failure of the transistor 124 in the first cell balancing circuit 31, and sends the first fault condition code to the vehicle controller 64. After step 360, the method advances to step 362.

At step 362, the microcontroller 62 makes a determination as to whether a difference between the first temperature value of the resistor 110 and the second temperature value of battery module 20 is greater than a threshold temperature difference value. If the value of step 362 equals "yes", the method advances to step 364. Otherwise, the method advances to step 366.

At step 364, the microcontroller 62 generates a second fault condition code indicating that the first cell balancing circuit 31 is continuously turned on, and sends the second fault condition code to the vehicle controller 64. After step 364, the method advances to step 366.

At step 366, the microcontroller 62 determines a second cell balancing current value indicating an amount of electrical current flowing through the resistor 210 of the second cell balancing circuit 32 based on the first, second, third, and fourth voltage values and a second resistance value. The second resistance value corresponds to a resistance of the resistor 210. The resistor 210 is electrically coupled in series with the third electrical sense line 43. In an exemplary embodiment, the microcontroller 62 determines the second cell balancing current value utilizing the following equation: second cell balancing current value=((third voltage value−fourth voltage value)−2*(second voltage value−first voltage value))/second resistance value. After step 366, the method advances to step 368.

At step 368, and the microcontroller 62 makes a determination as to whether the second cell balancing current value is less than the minimum desired current value. If the value of step 360 equals "yes", the method advances to step 370. Otherwise, the method advances to step 372.

At step 370, the microcontroller 62 generates a third fault condition code indicating an operational failure of the transistor 224 in the second balancing circuit, and sends the third fault condition code to the vehicle controller 64. After step 370, the method advances to step 372.

At step 372, the microcontroller 62 makes a determination as to whether a difference between the third temperature value of resistor 210 and the fourth temperature value of battery module 20 is greater than a threshold temperature difference value. If the value of step 372 equals "yes", the method advances to step 374. Otherwise, the method is exited.

At step 374, the microcontroller 62 generates a fourth fault condition code indicating that the second cell balancing circuit 32 is continuously turned on, and sends the fourth fault condition code to the vehicle controller 64. After step 374, the method is exited.

The above-described method can be at least partially embodied in the form of one or more memory devices or computer readable media having computer-executable instructions for practicing the method. The memory device can comprise one or more of the following: hard drives, RAM memory, flash memory, and other computer-readable media known to those skilled in the art; wherein, when the computer-executable instructions are loaded into and executed by one or more microcontrollers or processors, the one or more microcontrollers or processors become an apparatus programmed to practice the associated steps of the method.

The battery system described herein provides a substantial advantage over other battery systems. In particular, an advantage of the battery system is that battery system utilizes a microcontroller that determines operational fault conditions of a first cell balancing circuit utilizing voltages measured from the first and second cell balancing circuits. Further, the microcontroller determines operational fault conditions of the second cell balancing circuit utilizing voltages measured from the first and second cell balancing circuits. Still further, the microcontroller determined operational fault conditions in the first and second cell balancing circuits based on the first, second, and third temperature signals associated with the first cell balancing circuit, the battery module, and the second cell balancing circuit, respectively.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery system, comprising:
a battery module having first and second battery cells;
a first cell balancing circuit being electrically coupled to first and second electrical terminals of the first battery cell
a first temperature sensor generating a first temperature signal indicative of a temperature level of a first resistor in the first cell balancing circuit that is received by an integrated circuit;
a second temperature sensor generating a second temperature signal indicative of a temperature level of the battery module that is received by the integrated circuit;
the integrated circuit determining a first temperature value of the first resistor at a first time based on the first temperature signal, and sending the first temperature value to a microcontroller;
the integrated circuit determining a second temperature value of the battery module at the first time based on the second temperature signal, and sending the second temperature value to the microcontroller; and
the microcontroller generating a first fault condition code indicating that the first balancing circuit is continuously turned on if a difference between the first and second temperature values is greater than a threshold temperature difference value.

2. The battery system of claim 1, wherein:
the first cell balancing circuit being further electrically coupled to first and second electrical sense lines, the first cell balancing circuit having the first resistor and a first transistor therein, the first transistor being electrically coupled between the first and second electrical sense lines; the first resistor being electrically coupled in series with the first electrical sense line and being further electrically coupled to the first transistor; and
a second cell balancing circuit being electrically coupled to first and second electrical terminals of the second battery cell and the second electrical sense line and a third electrical transistor being electrically coupled between the second and third electrical sense lines.

3. The battery system of claim 2, wherein:
the integrated circuit measuring a first voltage between the second electrical sense line and the first electrical sense line at the first time while the first transistor in the first cell balancing circuit is commanded to be turned off by the microcontroller, and sending a first voltage value corresponding to the first voltage to the microcontroller;
the integrated circuit measuring a second voltage between the second electrical sense line and the first electrical sense line at a second time while the first transistor in the first cell balancing circuit is commanded to be turned on by the microcontroller, and sending a second voltage value corresponding to the second voltage to the microcontroller;
the integrated circuit measuring a third voltage between the third electrical sense line and the second electrical sense line at a third time while the second transistor in the second cell balancing circuit is commanded to be turned off by the microcontroller, and sending a third voltage value corresponding to the third voltage to the microcontroller;
the integrated circuit measuring a fourth voltage between the third electrical sense line and the second electrical sense line at a fourth time while the second transistor in the second cell balancing circuit is commanded to be turned on by the microcontroller, and sending a fourth voltage value corresponding to the fourth voltage to the microcontroller;
the microcontroller determining a first cell balancing current value indicating an amount of electrical current flowing through the first resistor of the first cell balancing circuit based on the first, second, third, and fourth voltage values and a first resistance value, the firm resistance value corresponding to a resistance of the first resistor; and
the microcontroller generating a second fault condition code indicating an operational failure of the first transistor in the first balancing circuit if the first cell balancing current value is less than a minimum desired current value.

4. The battery system of claim 3, wherein the first electrical terminal of the first battery cell being electrically coupled in series with the first electrical sense line, and the second electrical terminal of the first battery cell being electrically coupled in series with the first resistor in the first cell balancing circuit and the second electrical sense line; and the first electrical terminal of the second battery cell being electrically coupled to the second electrical sense line and to the second electrical terminal of the first battery cell, and the second electrical terminal of the second battery cell being electrically coupled in series with the second resistor in the second cell balancing circuit and a third electrical sense line, and the integrated circuit being electrically coupled to the first, second, and third electrical sense lines, and to the microcontroller.

5. The battery system of claim 3, wherein the microcontroller sends a first command message to the integrated circuit at the second time to command the integrated circuit to turn on the first transistor in the first cell balancing circuit, the integrated circuit receives the first command message and generates a first control signal to turn on the first transistor in the first cell balancing circuit in response to the first command message.

6. The battery system of claim 5, wherein the microcontroller sends a second command message to the integrated circuit at the fourth time to command the integrated circuit to turn on the second transistor in the second cell balancing circuit, the integrated circuit receives the second command message and generates a second control signal to turn on the second transistor in the second cell balancing circuit in response to the second command message.

7. The battery system of claim 5, wherein the microcontroller determining the first cell balancing current value utilizing a following equation: first cell balancing current value=((first voltage value−second voltage value)−2*(fourth voltage value−third voltage value)))/first resistance value.

8. The battery system of claim 3, wherein:
the microcontroller determining a second cell balancing current value indicating an amount of electrical current flowing through a second resistor of the second cell balancing circuit based on the first, second, third, and fourth voltage values and a second resistance value, the second resistor being electrically coupled in series with the third electrical sense line, the second resistance value corresponding to a resistance of the second resistor; and the microcontroller generating a third fault condition code indicating an operational failure of the second transistor in the second balancing circuit if the second cell balancing current value is less than the minimum desired current value.

9. The battery system of claim 8, wherein the microcontroller determining the second cell balancing current value utilizing a following equation:

second cell balancing current value=((third voltage value−fourth voltage value)−2*(second voltage value−first voltage value))/second resistance value.

10. The battery system of claim 1, further comprising:

a third temperature sensor generating a third temperature signal indicative of a temperature level of a second resistor in the second balancing circuit that is received by the integrated circuit;

the integrated circuit determining a third temperature value of the second resistor at a second time based on the third temperature signal, and sending the third temperature value to the microcontroller;

the integrated circuit determining a fourth temperature value of the battery module at the second time based on the second temperature signal, and sending the fourth temperature value to the microcontroller; and the microcontroller generating a second fault condition code indicating that the second balancing circuit is continuously turned on if a difference between the third and fourth temperature values is greater than the threshold temperature difference value.

* * * * *